United States Patent [19]
Chén et al.

[11] Patent Number: 5,604,152
[45] Date of Patent: Feb. 18, 1997

[54] CVD PROCESS FOR DEPOSITION OF AMORPHOUS SILICON

[75] Inventors: Chao-Yang Chén; Fu-Yang Yu, both of Hsin-chu, Taiwan

[73] Assignee: United Microelectronics Corporation, Hsin-chu, Taiwan

[21] Appl. No.: 344,011

[22] Filed: Nov. 23, 1994

[51] Int. Cl.$^6$ .................................................. H01L 21/20
[52] U.S. Cl. ..................... 437/101; 437/233; 427/585; 427/587; 427/588
[58] Field of Search ..................... 437/101, 233; 427/585, 587, 588, 248.1, 255.1

[56] References Cited

FOREIGN PATENT DOCUMENTS 0011620  1/1984  Japan ................................... 437/101

OTHER PUBLICATIONS

"The LPCVD Polysilicon Phosphorous Doped in situ as an Industrial Process" by A. Baudrant et al. in J. Electrochem. Soc. Solid State Sci & Tech, May 1982, pp. 1109–1115.

"Kinetics and Mechanism of Amorphous Hydrogenated Silicon By Homogeneous Chemical Vapor Deposition" by B. A. Scott et al., in Applied Physics Letters, Jul. 1981.

Scott et al. in Jr. De Physique, College, C4, Oct. 1981, pp. C4, 635–638.

*Primary Examiner*—Nam Nguyen
*Assistant Examiner*—Ramamohan Rao Paladugu
*Attorney, Agent, or Firm*—William H. Wright

[57] ABSTRACT

A novel process for depositing amorphous silicon has been described. The process features the homogeneous reaction of, decomposition of SiH2 and deposition of amorphous silicon, in a horizontal LPCVD reaction chamber. The SiH2 is produced by initially breaking down SiH4 in a heated autoclave apparatus, and then transferring the SiH2 to the LPCVD system through heated feed lines. This homogeneous process results in excellent thickness and resistivity uniformity for wafers placed along the horizontal axis of the LPCVD chamber.

20 Claims, 2 Drawing Sheets

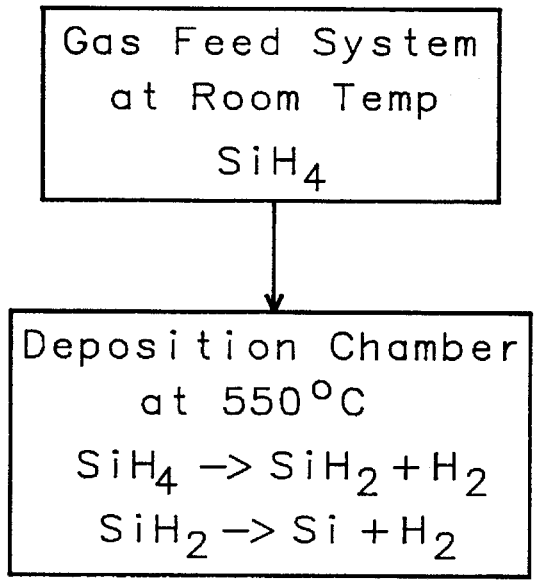
*FIG. 1 - Prior Art*
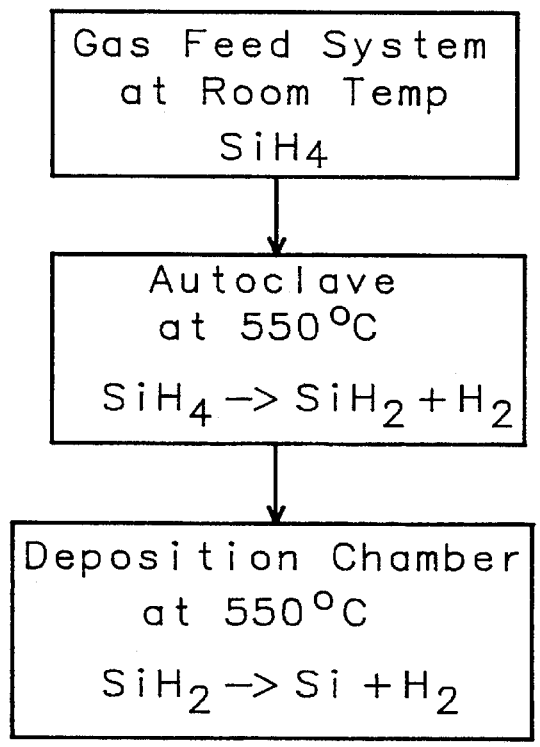
*FIG. 2*

CVD PROCESS FOR DEPOSITION OF AMORPHOUS SILICON

BACKGROUND OF THE INVENTION (1) Field of the Invention

The present invention relates to a innovative configuration of a low pressure chemical vapor deposition, (LPCVD), and gas feed system, used to grow materials, specifically polysilicon, used in the fabrication of semiconductor devices.

(2) Description of Prior Art

The semiconductor chip industry has been able to continually reduce cost of their products, while still providing increased performance and reliability. Most obvious to those skilled in the art has been the trend to sub-micrometer images, allowing more circuits to fabricated per chip, resulting in large increases in density with corresponding reductions in cost. This has been accomplished primarily by the advances in photolithographic technology. Greater sophistication in cameras, as well as the use of more sensitive photoresist materials, have allowed the trend of microminiturazation to advance at a rapid pace. Other disciplines, also needed in the semiconductor fabrication sequence, such as reactive ion etching, (RIE), and ion implantation, (I/I), have also experienced similar optimizations. The use of RIE processes have allowed the sub-micrometer images, created via use of the advanced photo cameras and sensitive photoresists, to be easily transferred to the underlying material. The ability of RIE to anisotropically remove semiconductor materials, without eroding the overlying photoresist mask, and being able to stop, or slow down the removal process at endpoint, has also contributed to the growth of microminituraztion. Ion implantation has allowed for precise levels of impurities, needed to obtain the desired electrical result, to be placed in specific areas of the semiconductor chip. Thus it can seen that contributions to the development of smaller, faster, less costly semiconductor chips, have come from several chip fabrication areas.

One discipline, also essential for the fabrication of semiconductor chips, is chemical vapor deposition, (CVD). The ability to deposit various materials, that are used for semiconductors, that would otherwise be difficult to achieve via other semiconductor processes, has also been a major factor in growth of this industry. Materials such as silicon nitride, low temperature silicon dioxide, etc, have been routinely obtained using CVD processing. The development of low pressure chemical vapor deposition, (LPCVD), has rewarded users with a more advanced deposition product. The LPCVD process results in improvements in the thickness and resistivity uniformity, regards to within a wafer and also from wafer to wafer. This has allowed depositions to be performed on large quantities of wafers, in a single sequence, resulting in excellent thickness uniformity. However one type of LPCVD process, the deposition of amorphous or polycrystalline silicon, still has not reached the level of thickness and resistivity uniformity desired by semiconductor engineers. "The LPCVD Polsilicon Phosphorous Doped in Situ as an Industrial Process", by A. Baudrant, et al, in J. Electrochem. Soc. Solid State Sci. and Tech., May 1988, pp. 1109–1115, describes the use of a specific set of reactant concentrations that result in an improvement in thickness and resistivity uniformity improvement. Another article, "Kinetics and Mechanism of Amorphous Hydrogenated Silicon By Homogeneous Chemical Vapor Deposition", by B. A. Scott et al, in Applied Physics Letters, July 1981, shows that the critical event in achieving uniform polysilicon films, via CVD processing, is to develop a homogeneous deposition process. The routine method to grow LPCVD polysilicon is to inject a specific amount of silane, SiH4, into the reactor tube that contains the wafers waiting to be coated. Scott suggests that this results in a heterogeneous reaction., since the silane first, has to reach the temperature of the reactor tube, then decompose to silylene, (SiH2), and hydrogen, (H2), and finally deposit silicon on the wafer. The many stages result in poor uniformity.

This invention will desribe a novel apparatus that allows the silane gas to decompose to silylene and hydorgen, prior to reaching the reactor, thus a homogeneous process is achieved highlighted by significant improvements in both thickness and resistivity uniformity.

SUMMARY OF THE INVENTION

It is an object of this invention to provide a low pressure chemical vapor deposition system that will allow the growth of amorphous silicon to occur with excellent thickness and resistivity uniformity within a wafer, as well as from wafer to wafer.

It is another object of this invention to have the silane, (SiH4), source, decomposed to silylene, (SiH2) and hydrogen, (H2), prior to entering the wafer deposition system.

It is still another object of this invention to provide an autoclave apparatus, as part of the gas feed system, that will allow the SiH4 to decompose to SiH2 and H2 prior to entering the wafer deposition system.

In accordance with this present invention an LPCVD system is described that allows the deposition of amorphous silicon to occur using a homogeneous reaction. The SiH4 gas enters an autoclave apparatus, heated to a specific temperature, that results in the decomposition of SiH4 to SiH2 and H2. These reactants then pass through heated feed lines and enter a horizontal LPCVD chamber. The reaction occurring in the deposition chamber is the decomposition of SiH2, resulting in uniform deposition of amorphous silicon on the substrates residing in the horizontal chamber.

BRIEF DESCRIPTION OF THE DRAWINGS

FIG. 1 is a "Prior Art" flow chart illustrating the process for heterogeneous depositions.

FIG. 2 is a flow chart for illustrating the process for homogeneous depositions according to the present invention.

DESCRIPTION OF THE PREFERRED EMBODIMENTS

Figure 3:
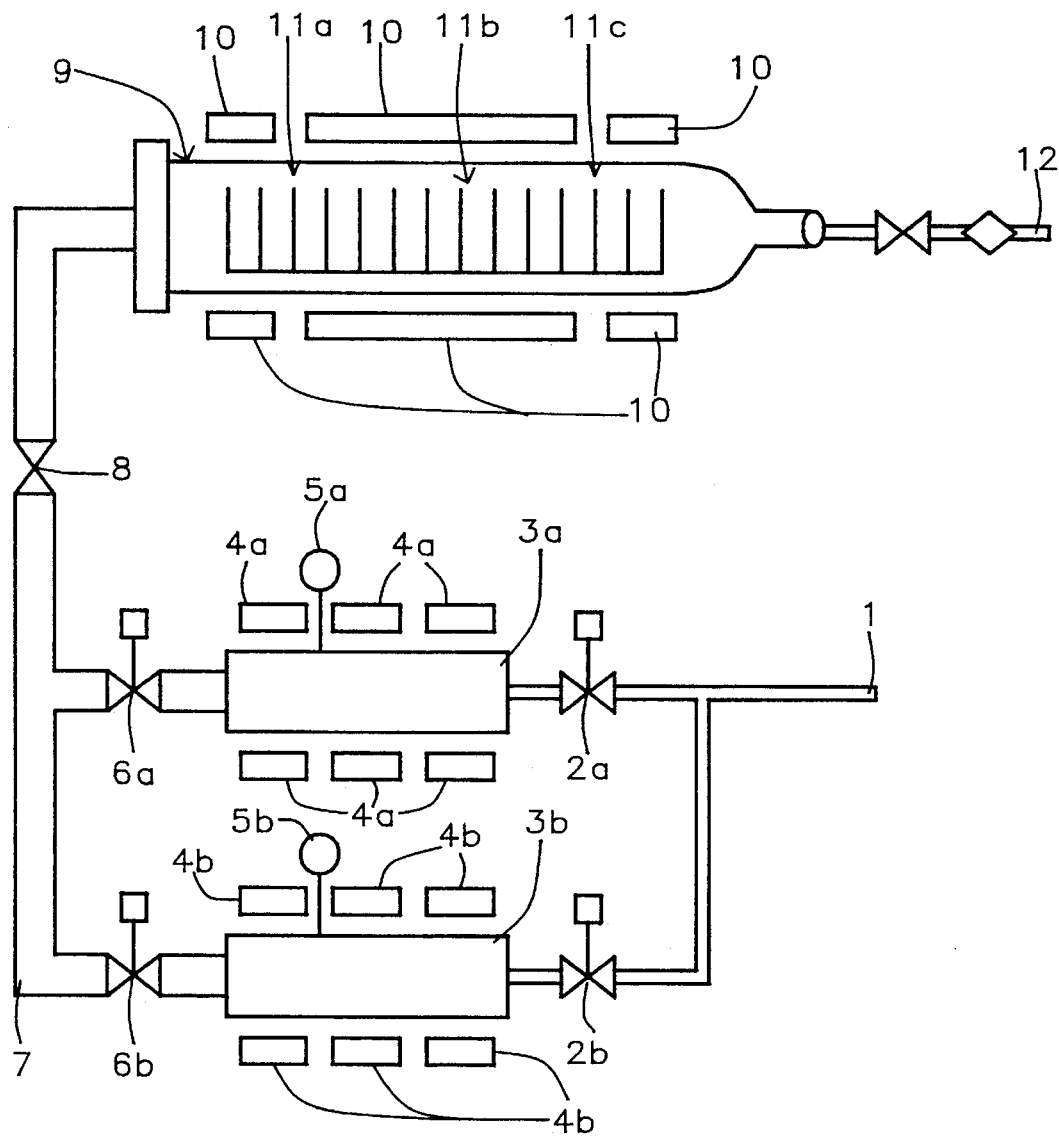
FIG. 3 schematically describes the apparatus used to obtain the homogeneous amorphous silicon deposition.

FIG. 2, shows the basic differences between the heterogeneous and homogeneous reactions that occur during the amorphous silicon deposition cycle. Referring to the heterogeneous example, the silane, (SiH4), gas is at room temperature entering the deposition system. Therefore the initial reaction occurring is the decomposition of SiH4 to SiH2 and H2. This creates a severe H2 concentration gradient along the horizontal axis of the deposition chamber. The next reaction, consisting of the decomposition of SiH2 to Si and H2, is adversely influenced by the severe H2 gradient previously created. The H2 gradient influences the amount and rate of the SiH2 decomposition, and thus poor thickness uniformity will result. In addition the level of H2 directly influences the number of dangling bonds on the surface of the depositing amorphous silicon. The dangling bonds in turn influence the resistivity of the amorphous silicon, and so even if thickness uniformity is acceptable, large variations in resistivity can occur. Thus the heterogeneous reaction, the decomposition of SiH4, followed by decomposition of SiH2, both occurring in the deposition chamber, can result in poor amorphous silicon thickness and resistivity uniformities, when comparing wafers placed sequentially in a horizontal deposition chamber.

The homogeneous reaction, shown in FIG. 2, proceeds initially with the SiH4 gas experiencing decomposition to SiH2 and H2, prior to entering the deposition chamber. This is accomplished by passing the SiH4 through an autoclave at a temperature between about 600° to 700° C., at a pressure less then about 10 atmospheres. Now in contrast to the heterogeneous reaction, the gases entering the reaction chamber are SiH2 and H2, and therefore the only reaction needed to take place in the rection chamber is the decomposition of SiH2 into silicon. This in turn results in an H2 concentration gradient, much flatter than the gradient resulting from the heterogeneous reaction, and subsequently allowing a more uniform deposition of amorphous silicon to occur on wafers situated across the entire length of the horizontal chamber. The deposition is more uniform in terms of resistivity, as well as thickness.

FIG. 3 now describes the LPCVD system, featuring the autoclave apparatus, in detail. Room temeperature SiH4 is injected at inlet, 1. A front valve, 2a, when in the open position, allows passage of SiH4 to an stainless steel autoclave system, 3a. The stainless steel autoclave can withstand pressures of approximately 10 atmospheres. Resistance heaters, 4a, surrounding the autoclave, are used to heat the SiH4 gas. When the pressure gauge, 5a, reaches a value between about 2 to 6 atmospheres, the front valve, 2a, closes, and the resistance heaters raise the temperature of the SiH4 in the autoclave to between about 600° to 700° C. At this point the SiH4 is being decomposed to SiH2 and H2, with the level of decomposition determined by the pressure level. When the pressure reaches about 10 atmospheres the rear valve, 6a, opens, allowing SiH2 and H2 to pass through heated feed lines, 7, to a flow control valve, 8. The flow control valve is opened to allow between about 100 to 200 sccm of SiH2 to enter the horizontal deposition chamber, 9. The chamber is heated to a temperature between about 500° to 650° C., via use of a three zone resistance heater, 10. At this temperature the SiH2 is decomposed to Si and H2, and the wafers sitting in a quartz boat are coated with amorphous silicon. The wafers at the source end of the boat, (first to experience the SiH2), labeled 11a, through the wafers in the center, 11b, including the wafers at the load end, (last to experience the SiH2), labeled 11c, all result in a uniform deposition of amorphous silicon. Finally the residual SiH2 and H2 exit via outlet, 12.

Referring again to pressure gauge 5a, when the rear valve, 6a, is opened and SiH2 is being transported through to the deposition chamber, it is possible that more SiH2 is needed, and can not be supplied solely by a single autoclave system. Therefore if the pressure reading on gauge, 5a, drops below about 1 atmosphere, rear valve, 6a, closes and rear valve, 6b, opens to supply additional SiH2 to the deposition zone. The configuration of auxiliary autoclave system, consisting of the autoclave, 3b, heaters, 4b, pressure gauge, 5b, and rear valve, 6b, are identical to the primary unit.

This novel LPCVD system can be used for deposition of amorphous and polycrystalline silicon, as well as for other materials that would benefit from a more controlled chemical vapor deposition process. The films supplied by this deposition process can be used for the fabrication of MOSFET, as well as for bipolar devices.

While this invention has been particularly shown and described with reference to the preferred embodiments thereof, it will be understood by those skilled in the art that various changes in form and details may be made without departing from the spirit and scope of this invention.

What is claimed is:

1. A method of depositing amorphous silicon on semiconductor substrates comprising the steps providing said semiconductor substrates, placed sequentially in a deposition chamber;

injecting silane gas into an autoclave apparatus;

heating said silane gas in said autoclave apparatus;

decomposition of said silane gas to silylene gas and hydrogen in said autoclave apparatus at a pressure of greater than one atmosphere;

injection of said silylene and said hydrogen in said deposition chamber; and deposition of said amorphous silicon on said semiconductor substrates in said deposition chamber.

2. The method of claim 1, wherein said silane gas is at a temperature between about 20° to 25° C. when injected into said autoclave apparatus.

3. The method of claim 1, wherein said silane gas in said autoclave apparatus is heated to a temperature between about 600° to 700° C.

4. The method of claim 1, wherein the pressure reached in said autoclave apparatus at the conclusion of the decomposition reaction of said silane gas to said silylene and said hydrogen is about 10 atmospheres.

5. The method of claim 1, wherein the amount of said silylene injected into said deposition chamber is between about 100 to 200 sccm.

6. The method of claim 1, wherein the amount of hydrogen injected into said deposition chamber is between about 0 to 100 sccm, with a maximum of 200 sccm.

7. The method of claim 1, wherein the decomposition of said silylene in said deposition chamber occurs at a temperature between about 500° to 650° C.

8. The method of claim 1, wherein the deposition of said amorphous silicon, on said semiconductor substrates, in said horizontal deposition system, occurs at a temperature of between about 500° to 650° C., and at a pressure of between about 10 to 260 mtorr.

9. The method of claim 1, wherein the said deposition chamber is horizontal, and said semiconductor substrates are placed sequentially along the horizontal axis of said deposition chamber.

10. The method of claim 1, wherein the thickness of said deposited amorphous silicon, on said semiconductor substrates, is within about 2 to 5% uniformity for said semiconductor substrates placed across the length of the said horizontal deposition chamber.

11. The method of claim 1, wherein the resistivity said deposited amorphous silicon, on said semiconductor substrates, is within about 2 to 5% uniformity for said semiconductor substrates placed across the length of said horizontal deposition chamber.

12. A method of depositing amorphous silicon on semiconductor substrates using a homogeneous reaction comprising the steps of:

providing said semiconductor substrates, placed sequentially in a horizontal deposition chamber;

injecting silane gas into an autoclave apparatus;

heating, while maintaining pressure of said autoclave at more than one atmosphere, said silane gas in said autoclave apparatus to produce silylene and hydrogen;

injection of portions of said silylene and said hydrogen into said deposition chamber; and homogeneous reaction of said silylene and hydrogen to deposit said amorphous silicon on said semiconductor substrates in said deposition chamber.

13. The method of claim 12, wherein said silane gas is at a temperature between about 20° to 25° C. when injected into said autoclave apparatus.

14. The method of claim 12, wherein said silane gas in said autoclave apparatus is heated to a temperature between about 600° to 700° C.

15. The method of claim 12, wherein the pressure reached in said autoclave apparatus through decomposition of said silane gas to said silylene and said hydrogen is about 10 atmospheres.

16. The method of claim 12, wherein the amount of said silylene injected into said deposition chamber is between about 100 to 200 sccm.

17. The method of claim 12, wherein the amount of said hydrogen injected into said horizontal deposition chamber is between about 0 to 100 sccm, with a maximum of 200 sccm.

18. The method of claim 12, wherein decomposition of said silylene and deposition of said amorphous silicon occurs at a temperature between about 500° to 650° C. in said deposition chamber.

19. The method of claim 12, wherein the said semiconductor substrates are located sequentially along the horizontal axis of said horizontal deposition chamber.

20. The method of claim 12, wherein the thickness of said deposited amorphous silicon, and resistivity of said deposited amorphous silicon, on sequentially placed said semiconductor substrates, is within about 2 to 5% uniformity.

* * * * *